US008836354B2

(12) United States Patent
Dehkordi et al.

(10) Patent No.: US 8,836,354 B2
(45) Date of Patent: Sep. 16, 2014

(54) APPARATUS FOR THERMAL TESTING OF A PRINTED CIRCUIT BOARD

(75) Inventors: Karim Hosseini Dehkordi, Trabuco Canyon, CA (US); James Jerome Wagner, Rogers, MN (US); Saeed Taheri, Markham (CA); Farokh Eshragi Azar, Markham (CA)

(73) Assignee: Acculogic Corporation, Markham, Ontario (CA)

( * ) Notice: Subject to any disclaimer, the term of this patent is extended or adjusted under 35 U.S.C. 154(b) by 241 days.

(21) Appl. No.: 13/278,704

(22) Filed: Oct. 21, 2011

(65) Prior Publication Data
US 2012/0119769 A1 May 17, 2012

Related U.S. Application Data

(60) Provisional application No. 61/405,315, filed on Oct. 21, 2010.

(51) Int. Cl.
*G01R 31/00* (2006.01)
*G01R 31/28* (2006.01)
(52) U.S. Cl.
CPC .................................... *G01R 31/281* (2013.01)
USPC .................................................... 324/750.03

(58) Field of Classification Search
CPC ............. G01R 31/281; G01R 31/2812; G01R 31/2874; G01R 31/2887; G01R 31/2856; G01R 31/2896
USPC ................. 324/762.01–762.1, 754.01–754.3, 324/755.01–755.11, 763.01
See application file for complete search history.

(56) References Cited

U.S. PATENT DOCUMENTS 5,374,888 A * 12/1994 Karasawa ................ 324/750.23
7,701,222 B2 * 4/2010 Cases et al. ................... 324/501
2011/0028254 A1 2/2011 Bogner et al.

FOREIGN PATENT DOCUMENTS

GB              1 375 121         11/1974

* cited by examiner

*Primary Examiner* — Tung X Nguyen
(74) *Attorney, Agent, or Firm* — Rankin, Hill & Clark LLP

(57) ABSTRACT

An apparatus for thermal testing of a printed circuit board being electrically energized and being unpopulated or populated with electrical or electronic components is disclosed. The apparatus includes a device for pyrometrical scanning of surface temperatures, wherein the scanning device comprises a pyrometric sensor being movable for the purpose of scanning and being adjustable with respect to its distance from the printed circuit board. A method for operating such an apparatus is disclosed. The method includes adjusting the distance between the sensor and the printed circuit board during scanning.

6 Claims, 1 Drawing Sheet

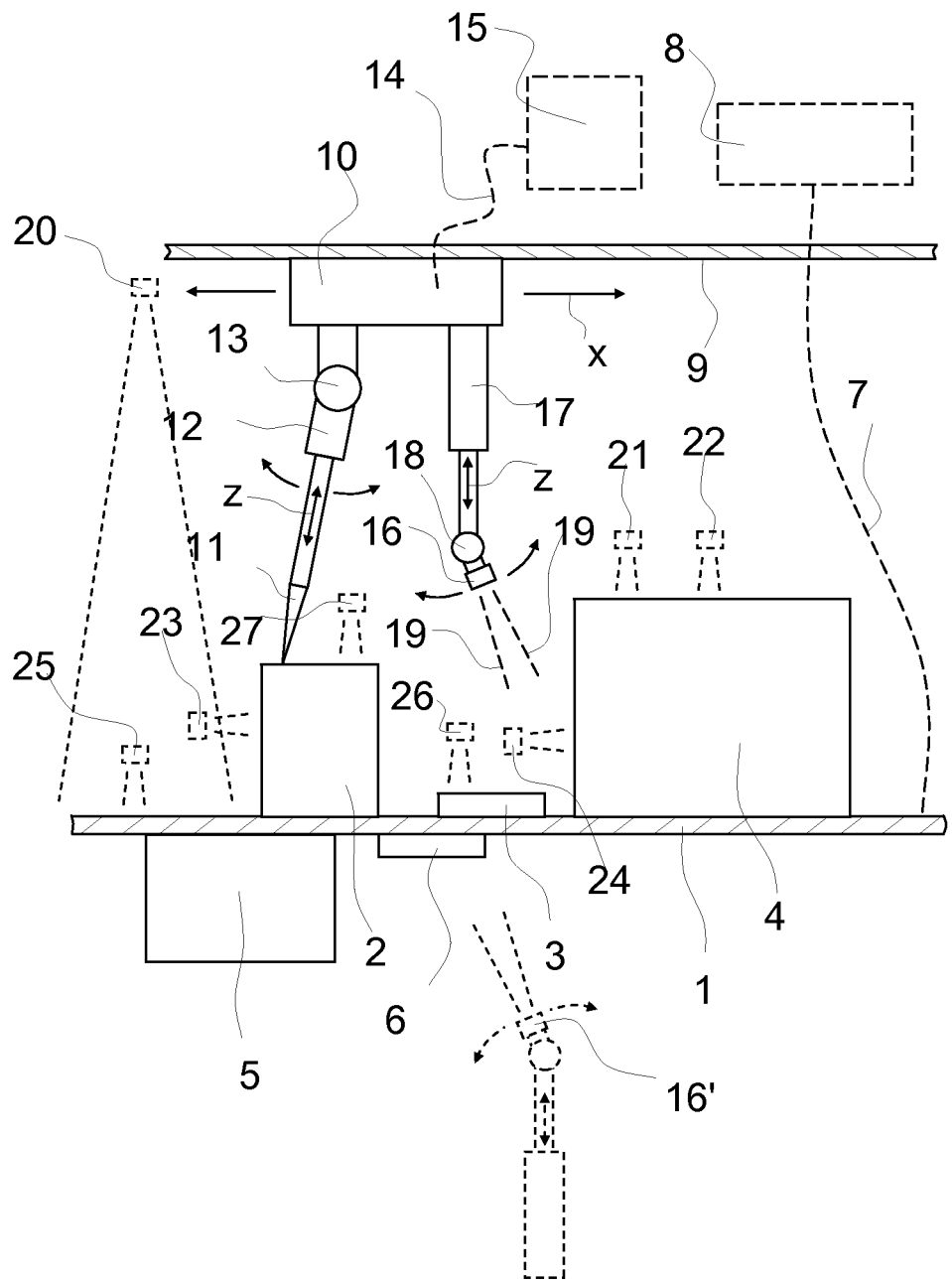

APPARATUS FOR THERMAL TESTING OF A PRINTED CIRCUIT BOARD

BACKGROUND OF INVENTION

1. Field of Invention

The invention relates to an apparatus for pyrometrically scanning surface temperatures of printed circuit boards, and to a method for operating said apparatus.

2. Description of Related Art

Printed circuit boards populated with electric or electronic components, also designated as electric printed circuit boards or printed circuits, are elementary constituents of virtually all technical apparatuses, from television sets through automobiles and aircraft to machine tools, and form the core components of every computer. There is always a very great deal dependent on the proper function of a printed circuit board. Faults on the printed circuit board therefore have to be found by rigorous tests and eliminated. For the purpose of testing various apparatuses and methods are known, which are employed individually or in combination.

Electric test apparatuses are known, which make contact electrically with the printed circuit board and apply test currents thereto. Functional tests are also carried out, during which the printed circuit board runs in the normal operating mode and is monitored in the process. Specific tests also serve only for examining individual components arranged on the printed circuit board.

Supplementary test methods also operate non-electrically, such as e.g. optical examinations by means of video cameras which can ascertain deviations from a good printed circuit board.

A further important test possibility is generic thermal testing, during which the surface temperatures of the printed circuit board are determined.

For this purpose, the printed circuit board is electrically energized, which generates heat in all the components. The temperature pattern can be detected and compared with that of a good printed circuit board. Deviations, for example in the case of an overloaded component, in the case of supply being lacking or in the case of a component being completely absent, can thus be found in a simple manner. It is also possible to test unpopulated printed circuit boards, in which the conductor tracks through which current flows exhibit different temperatures depending on material and geometry.

It is known, for the thermal testing of printed circuit boards to photograph the latter using a thermally sensitive digital camera, that is to say using an areal array of thermosensitive sensor pixels that directly yields an image. However, the sensitivity values in the temperature-sensitive pixels of such areal image sensors are not particularly good.

An individual specialized pyrometric sensor is better, which is commercially available for different temperature ranges and with very good sensitivities. Such pyrometric sensors are used e.g. in clinical thermometers for determining the temperature of the eardrum or for monitoring bread temperature in an oven, or else for monitoring the temperature of steel during forging. What is always essential here is the pyrometric measurement principle, that is to say the principle of measuring a surface temperature from a distance.

A pyrometric sensor sees an observation spot at a viewing angle, which, in one exemplary embodiment, produces an observation spot having a diameter of 1 cm at the observation distance of 6 cm. The desired overall image of the printed circuit board has to be assembled from a multiplicity of observation spots in a scanning process.

One apparatus of the generic type is disclosed in GB 1 375 121 where a pyrometric sensor is mounted in stationary fashion at a distance from the printed circuit board. Its viewing direction is deflected by a rotating mirror into a scanning line running over the printed circuit board. Transversely with respect thereto, the scanning movement is produced by the transport of the printed circuit board.

This known design enables area scanning using a pyrometric sensor. However, there are disadvantages owing to the fixed observation distance. Specifically, the latter leads to a fixed, that is to say invariable, resolution. That is unsatisfactory since either the scanning of large areas takes too long or, in the case of small-scale structures, the resolution is too coarse.

A further problem is that in the case of a sensor—observing at a diverging viewing angle—the size of the observation spot, that is to say the resolution, is dependent on the observation distance. If a flat surface is observed, then there is no problem, but there is a problem in the case of uneven surfaces, e.g. in the case of typical printed circuit boards which are populated with very thick components and where the temperature on the printed circuit board itself or on a very high component is intended to be determined alternatively. The resolutions are then different as a result of this change in the observation distance, which can in turn be a great disturbance. This can be designated as a depth of field problem.

BRIEF SUMMARY OF THE INVENTION

The object of the present invention is to improve the problems with resolution and depth of field in an apparatus of the generic type.

This object is achieved by means of a scanning device comprising a pyrometric sensor being movable for the purpose of scanning and being adjustable with respect to its distance from the printed circuit board.

According to the invention, the sensor itself is driven, to be precise not only for the purpose of image scanning, but in particular also with regard to its distance from the printed circuit board. A three-dimensional movement of the sensor is thus made possible, which can primarily be used to set the observation distance in a defined manner independently of the observed surface structure. That is to say that for any arbitrary surfaces, even in the case of very fissured population of the printed circuit board, the resolution can always be chosen to be sufficient and the observation distances can always be kept in a useable range, such that the depth of field problem mentioned above can be largely eliminated.

The apparatus is advantageously embodied such that the sensor is movable parallel to the printed circuit board in two directions, which, for the sake of simplicity, are positioned orthogonally and usually designated by X and Y. In a direction perpendicular thereto, the Z direction, a height drive is effected in the sense of a distance adjustment of the sensor relative to the printed circuit board. This results in a simply controllable apparatus which, in particular, can be controlled by means of commercially available control devices.

In this case, advantageously at least one pivoting drive is also added. It is also possible to provide a plurality of pivoting drives having different pivoting axes. That enables e.g. the optimized determination of the temperature at a side wall of a component rising up from the printed circuit board, which, viewed from above, would only enable an oblique view.

The sensor is advantageously mounted on the positioning device of a flying probe tester. Flying probe testers are known for electrical testing. Their positioning devices move contact-making needles to and fro over the printed circuit board and with them make contact with desired locations on the printed circuit board. In order to do that, the positioning device has to operate in X, Y and Z directions, that is to say is very well suited to the present purposes. In this case, the positioning device can also additionally bear needles as well. The electric and thermal testing can therefore be effected in combination using one test apparatus. US 2001/0028254 A1 discloses a flying probe tester suitable for the present purposes.

Advantageous methods for operating the apparatus according to the invention are described herein.

The distance of the sensor is adjusted during scanning. The resolution can thus be chosen.

The method firstly operates at the relatively large observation distance, that is to say with coarse resolution, which is very time-saving. This is followed by evaluation and determination of whether a temperature is exceeded somewhere. In a partial region identified as conspicuous, scanning can then be effected with a smaller distance, that is to say with high resolution, in order to be able to identify the defective component from a plurality of components situated there.

Alternatively, the method operates at a fixed distance from the areas respectively detected. This results in an overall image having the same high resolution at all locations.

BRIEF DESCRIPTION OF THE DRAWINGS

The drawing illustrates the invention by way of example and schematically in a single FIG. 1, which shows a section through a portion of a test apparatus according to the invention.

DETAILED DESCRIPTION OF THE INVENTION

FIG. 1 shows an excerpt from a test apparatus, in which, with retaining means (not illustrated), a printed circuit board 1 is held in a fixed position for testing. On its top side, the printed circuit board 1 is populated with, in the exemplary embodiment illustrated, three electric or electronic components 2, 3 and 4, which are soldered at soldering locations, for example, with conductor tracks (not illustrated) on the printed circuit board 1. The exemplary embodiment involves a printed circuit board populated on both sides, which is also populated with further components 5 and 6 on the underside.

The printed circuit board is connected via lines 7 (indicated schematically) to a supply device 8, which supplies the electric circuit on the printed circuit board 1 with supply voltages, signals and the like, in order to operate the components 2 to 6 with electric power, which leads to heating of the components.

Arranged at a distance parallel to the printed circuit board 1 there is a movement plane 9 on which a positioning device in the form of a slide 10 is arranged such that it is movable in the arrow direction parallel to the movement plane 9. With drive means (not illustrated) the slide 10 is adjustable not only in the X direction illustrated but also perpendicular to the plane of the drawing in the Y direction parallel to the movement plane 9, that is to say can be moved over every location on the printed circuit board 1.

The positioning device 9, 10 illustrated can originate from a commercially available flying probe tester and bears, as usual, extending toward the printed circuit board 1, a test needle 11, which is adjustable in the needle direction by means of a Z drive 12, which is in turn connected to the slide 10 via a pivoting drive 13. This is a similar design to that illustrated in US 2001/0028254 A1, only a different manner of illustration having been chosen.

With the tip of the needle 11, by displacing the slide in the X and Y directions and by adjusting the needle 11 in the Z direction, any arbitrary point on the surface of the printed circuit board 1 itself or on the surface e.g. of the component 2, as illustrated in FIG. 1, can be contacted and electrically measured. For this purpose, the slide 10 is connected to a measurement and evaluation device 15 by measurement lines 14.

A pyrometric sensor 16 is also arranged on the slide 10, said sensor being connected to the slide 10 in a similar manner to the test needle 11, namely via a Z drive 17 and a pivoting drive 18.

The test needle 11 can also be absent.

The pyrometric sensor 16 is likewise connected to the measurement and evaluation device 15 via the measurement lines 14. Its viewing angle is represented by the dashed delimiting lines 19. As can be seen in FIG. 1, the pyrometric sensor 16, by means of the movement of the slide 10 in the X and Y directions, can be brought over any point of the printed circuit board 1 and can be brought there to any height position above the latter and be aligned by the pivoting of the pivoting drive 18, e.g. with a ball pivoting drive also in all directions.

With suitable drive control, the pyrometric sensor 16 can follow the surface regions of the printed circuit board 1 in a grid-type fashion in the X and Y directions and can determine the respective surface temperatures and store or display them via the evaluation device 15.

Various methods for operating the apparatus illustrated are possible, two of which are explained in particular below:

Some positions of the pyrometric sensor 16 which are possible by means of movement are illustrated by dashed lines in FIG. 1. In the position 20, the sensor can be situated very far above the printed circuit board 1. Consequently, the observation spot is relatively large as a result of the large distance for a given viewing angle. At this distance, the sensor can be moved above the printed circuit board. Given this restricted resolution, however, it can e.g. only recognize that the component 4 is too hot. There is then the possibility of moving the sensor into the positions 21 and 22 very close to the surface of the component 4 and to move it there, parallel to the surface of the component 4, in order then to represent the surface of the component 4 with higher resolution.

By adjusting the pivoting drive 18, it is possible to arrange the sensor 16 in a laterally viewing fashion, e.g. in the positions 23 and 24 in which it can scan the side walls of the components 2 and 4, respectively.

The sensor can be brought very far down in the positions 25 and 26 to direct proximity with the printed circuit board 1, in order to scan there e.g. the very low component 3 or the surface of the printed circuit board 1 itself with high resolution.

It is possible in this case, with suitable control, to move the sensor 16 above the printed circuit board 1 in such a way that it assumes the positions 25, 23, 27, 26, 24, 21 and 22 e.g. successively on a scanning track, that is to say it follows the surface profile at a fixed distance. Consequently, the entire surface including the lateral areas of the components can be scanned with constant, high resolution.

For thermal scanning of the underside of the printed circuit board 1, a further sensor 16' can be arranged below the printed circuit board 1 and driven by devices that will not be explained in greater detail.

An unpopulated printed circuit board (not illustrated) can also be thermally tested. Fault-dictated deviations on the conductor tracks heated by current flow can be identified in this way.

Important results can also be obtained with dynamic tests in which heating and cooling processes are tracked. In this case, e.g. the entire printed circuit board or one of the components, e.g. an integrated circuit, can be started anew with a reset command and observed in the case of the thermal changes resulting therefrom.

The invention claimed is:

1. An apparatus for thermal imaging of a printed circuit board that is electrically energized and is unpopulated or populated with electrical or electronic components and is held in a fixed position for said thermal imaging, said apparatus comprising a device for pyrometrical scanning of surface temperatures of said circuit board, wherein said device for pyrometrical scanning comprises:
   a pyrometric sensor that is capable of sensing an observation spot; and
   a control device that is configured to move the pyrometric sensor in directions parallel to a plane defined by the printed circuit board and also in a direction that is perpendicular to said plane during pyrometrical scanning such that a multiplicity of observation spots are sensed by the pyrometric sensor for assembly into a thermal image.

2. The apparatus according to claim 1, wherein the sensor is configured to be pivotably adjustable.

3. The apparatus according to claim 1, wherein the sensor is arranged on a positioning device of a flying probe tester.

4. A method for acquiring a thermal image of a printed circuit board, the method comprising:
   holding the printed circuit board in a fixed position;
   providing an apparatus comprising:
   a pyrometric sensor that is capable of sensing an observation spot; and
   a control device that is configured to move the pyrometric sensor;
   sensing surface temperatures of the printed circuit board using the pyrometric sensor of the apparatus as the pyrometric sensor is moved by the control device in directions parallel to a plane defined by the printed circuit board and also in a direction that is perpendicular to said plane such that a multiplicity of observation spots are sensed by the pyrometric sensor; and
   assembling the thermal image from the multiplicity of observation spots.

5. The method according to claim 4, wherein a surface region of the printed circuit board is scanned by the sensor at a first distance from the printed circuit board, results from said scan are evaluated, and partial regions identified as conspicuous from said scan are rescanned by the sensor at a smaller distance from the printed circuit board than the first distance in a subsequent scan.

6. The method according to claim 4, wherein the scanning of the printed circuit board is effected at least in regions in such a way that the sensor maintains a fixed distance from surface areas of the printed circuit board in said regions during scanning.

* * * * *